(12) United States Patent
Ellis

(10) Patent No.: US 6,746,615 B1
(45) Date of Patent: Jun. 8, 2004

(54) METHODS OF ACHIEVING SELECTIVE ETCHING

(75) Inventor: Christina Ann Ellis, Mound, MN (US)

(73) Assignee: FSI International, Inc., Chaska, MN (US)

( * ) Notice: Subject to any disclaimer, the term of this patent is extended or adjusted under 35 U.S.C. 154(b) by 516 days.

(21) Appl. No.: 09/661,688

(22) Filed: Sep. 14, 2000

(51) Int. Cl.⁷ .............................................. C03C 15/00
(52) U.S. Cl. ............................ 216/57; 216/80; 216/91; 216/97; 438/704; 438/738; 438/743; 438/748; 438/756
(58) Field of Search ........................... 216/57, 63, 72, 216/80, 91, 97; 438/704, 706, 738, 743, 745, 748, 756

(56) References Cited

U.S. PATENT DOCUMENTS

| | | | |
|---|---|---|---|
| 4,522,674 A | 6/1985 | Ninomiya et al. .......... 156/345 |
| 4,749,440 A | 6/1988 | Blackwood et al. ......... 156/646 |
| 4,938,815 A | 7/1990 | McNeilly .................... 156/612 |
| 5,169,408 A | * 12/1992 | Biggerstaff et al. ........ 29/25.01 |
| 5,173,152 A | 12/1992 | Tanaka ....................... 156/646 |
| 5,262,695 A | 11/1993 | Kuwano et al. ............. 310/309 |
| 5,376,233 A | 12/1994 | Man ........................... 156/662 |
| 5,626,779 A | 5/1997 | Okada ........................ 219/201 |
| 5,635,102 A | 6/1997 | Mehta ........................ 428/428 |
| 5,658,417 A | 8/1997 | Watanabe et al. ........... 156/345 |
| 5,744,402 A | 4/1998 | Fukazawa et al. ........... 438/734 |
| 6,036,786 A | 3/2000 | Becker et al. ................. 134/2 |

FOREIGN PATENT DOCUMENTS

EP    0 782 177 A2  *  7/1997  ........... H01L/21/00

* cited by examiner

*Primary Examiner*—Allan Olsen
(74) *Attorney, Agent, or Firm*—Vidas, Arrett & Steinkraus

(57) ABSTRACT

An in-process microelectronics device is treated by applying a heated liquid to the surface of the in-process microelectronics device, removing a portion of the liquid from the surface of the in-process microelectronics device and applying anhydrous HF gas to the surface of the in-process microelectronics device.

23 Claims, 1 Drawing Sheet

METHODS OF ACHIEVING SELECTIVE ETCHING

BACKGROUND OF THE INVENTION

In semiconductor device processing, oxides of silicon are used in many different forms for many applications. Dense, thermally grown oxides of silicon are typically used as the primary gate dielectric film in MOS (metal oxide-silicon) transistors. Steam grown thermal oxides are commonly used as a field oxidation dielectric layer. Undoped chemically deposited oxides, such as tetraethylorthosilicate derived oxide (TEOS), produced by wet or vapor (CVD) processes are other types of dense oxides commonly encountered. Other forms of silicon oxide commonly encountered are porous. Examples include doped oxides such as phosphosilicate glass (PSG) and borophosphosilicate glass (BPSG), which are commonly used as inter-metal layer dielectrics because they can be easily planarized with an elevated temperature reflow process. Spin-on-glass (SOG) is another porous oxide used in dielectric applications where planarization is critical. A SOG is a siloxane-type polymer in an organic solvent which is deposited in liquid form and then cured at elevated temperature to form a solid silicon oxide film. Other porous silicon oxides commonly encountered include borosilicate glass (BSG), boron doped TEOS, phosphorous doped TEOS and boron/phosphorous doped TEOS (BP TEOS).

Many semiconductor device manufacturing processes require selective etching processes to allow for removal of one form of silicon oxide in preference to another form of silicon oxide or to another material.

It is known, from U.S. Pat. No. 4,749,440, to use anhydrous hydrogen fluoride gas in the presence of water vapor to effect silicon oxide removal. Using a commercial embodiment of this technology sold under the Excalibur® brand by FSI International, Chaska, Minn., U.S.A., selectivities between specific oxides such as phosphorous silica glass (PSG) and thermal oxide have been demonstrated up to 10,000:1.

It is further known from U.S. Pat. No. 5,635,102 to selectively remove a porous silicon oxide layer from a substrate by exposing the substrate to a flowing anhydrous gaseous environment consisting of anhydrous inert gas and adding anhydrous hydrogen fluoride gas to the gaseous environment for a pulse time which is at most only shortly longer than that required to initiate etching of the dense silicon oxide, flushing the gaseous environment with anhydrous inert gas for a time sufficient to remove the hydrogen fluoride and water vapor generated by the etching of the porous oxide and, repeating the adding and flushing steps until the porous oxide layer has been removed.

All US patents and applications and all other published documents mentioned anywhere in this application are incorporated herein by reference in their entirety.

The invention in various of its embodiment is summarized below. Additional details of the invention and/or additional embodiments of the invention may be found in the Detailed Description of the Invention below.

BRIEF SUMMARY OF THE INVENTION

The invention is directed in one embodiment to a method of selectively etching an in-process microelectronics device comprising the steps of providing an in-process microelectronics device comprising a first oxide and a second oxide, applying liquid water at a predetermined temperature to the surface of the in-process microelectronics device, removing a portion of the liquid water from the surface of the in-process microelectronics device, at least a portion of the liquid water remaining on the in-process microelectronics device, and selectively etching at least a portion of the surface of the in-process microelectronics device by applying anhydrous HF gas and optionally water vapor to the surface of the in-process microelectronics device. The temperature of the liquid water is predetermined to facilitate selectively etching one of the oxides relative to the other oxide during the selectively etching step.

The instant invention is further directed to a method of treating an in-process microelectronics device having at least one oxide thereon comprising the steps of providing an in-process microelectronics device having at least one oxide thereon, applying a liquid cleaning fluid to the surface of the in-process microelectronics device, the liquid cleaning fluid at a temperature above ambient, removing a portion of the liquid cleaning fluid from the surface of the in-process microelectronics device, at least a portion of the liquid cleaning fluid remaining on the surface of the in-process microelectronics device and applying anhydrous HF gas and optionally water vapor to the surface of the in-process microelectronics device to etch an oxide on the surface of at least a portion of the in-process microelectronics device.

The instant invention is further directed to a method for etching a surface of an in-process microelectronics device comprising the steps of positioning at least one in-process microelectronics device on a rotatable support, causing the rotatable support to rotate such that the in-process microelectronics device rotates around an axis, causing a heated liquid to contact and preheat the in-process microelectronics device as the in-process microelectronics device rotates about the axis and causing a gaseous etchant to etchingly contact the in-process microelectronics device as the in-process microelectronics device rotates about the axis.

BRIEF DESCRIPTION OF THE SEVERAL VIEWS OF THE DRAWING(S)

DETAILED DESCRIPTION OF THE INVENTION

Figure 1:
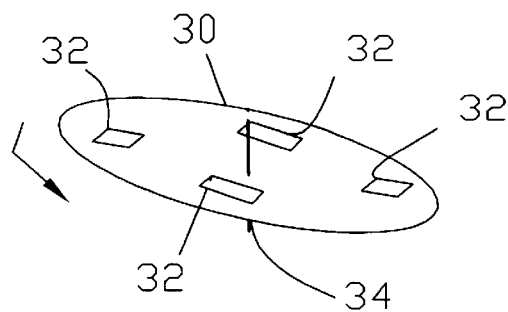
FIG. 1 shows an in-process microelectronics device on a rotatable support.

While this invention may be embodied in many different forms, there are described in detail herein specific embodiments of the invention. This description is an exemplification of the principles of the invention and is not intended to limit the invention to the particular embodiments illustrated.

In the embodiments described herein, various methods are provided for treating an in-process microelectronics device. Desirably, the in-process microelectronics device comprises silicon and/or gallium arsenide. Suitable in-process microelectronics devices include but are not limited to a silicon or gallium arsenide wafer or substrate. The in-process microelectronics device may optionally include circuitry, micromachinery or other microstructures thereon. Micromachines have been described in numerous publications including U.S. Pat. Nos. 5,262,695, 5,626,779 and 6,036,786.

In one embodiment, the instant invention is directed to a method of selectively etching an in-process microelectronics device. The method comprises the steps of providing an in-process microelectronics device, applying liquid, heated water to the surface of the in-process microelectronics device, removing a portion of the water from the surface of the in-process microelectronics device, a portion of the liquid water remaining on the in-process microelectronics device and applying anhydrous HF gas and optionally water vapor or other solvents to the surface of the in-process microelectronics device.

The application of liquid heated water to an in-process microelectronics device followed by anhydrous HF and optionally water vapor or other solvents results in a highly selective oxide etch of doped oxides over undoped oxide films on the same in-process microelectronics device.

An in-process microelectronics device is placed in a treatment chamber and liquid, heated water, desirably distilled and deionized, is applied to the surface of the in-process microelectronics device. It is significant that the water is provided in liquid form rather than in vapor form. Desirably, the liquid water will be heated to a temperature above ambient and less than or equal to 100° C. More desirably, the liquid water will be provided at a temperature of at least 45° C. Even more desirably, the liquid water will be provided at a temperature of between 60° C. and 90° C. and most desirably, between 70° C. to 90° C. The process may be employed at ambient temperature, but at such lower temperatures, both thermal oxides and undoped oxides are etched and the selectivity of the etch is reduced. Use of water at higher temperatures above about 90° C. may cause increased etch nonuniformity.

Desirably, the in-process microelectronics device is exposed to the liquid heated water for a period of at least 5 seconds. More desirably, the exposure lasts for a period ranging from 5 seconds to 10 seconds. Lengthier periods of exposure are also contemplated. It is believed, however, that with lengthier periods of exposure, the efficiency of the process is diminished. The desired period of exposure will also vary with the temperature of the water. Thus, it may be desirable to expose the in-process microelectronics device to the liquid heated water for a lengthier period of time where the liquid water is provided at temperatures toward the lower end of the 60° C. to 90° C. temperature range or lower and for a shorter period of time where the water is heated to the upper end of the 60° C. to 90° C. temperature range. The period of exposure should at least be sufficient to heat the in-process microelectronics device to a temperature of at least 45° C. but no more than 100° C.

A portion of the liquid water is then removed from the surface of the in-process microelectronics device such as by spinning the in-process microelectronics device. Desirably, the bulk of the liquid water is removed from the surface of the in-process microelectronics device. More desirably, about 10 monolayers of water or fewer should remain on the surface of the in-process microelectronics device. Water may be removed through other suitable techniques as well, as are known in the art. Care must be taken, however, not to remove all of the liquid water from the surface of the in-process microelectronics device. Desirably, no more than about 10 monolayers of water will remain on the surface of the in-process microelectronics device. Moreover, following the removal of liquid water from the in-process microelectronics device, the temperature of the wafer should remain above ambient.

The in-process microelectronics device may then, optionally, be treated using water vapor and optionally a heated or unheated carrier gas.

The in-process microelectronics device is next treated with gaseous anhydrous hydrogen fluoride (HF) and etched. Desirably, the gaseous anhydrous HF is diluted in an inert carrier gas. Suitable carrier gases include nitrogen, argon, helium, $CO_2$, Xe, Kr, Ne, Rn, clean dry air and combinations thereof. Optionally, water vapor or another solvent may be provided with the gaseous anhydrous HF to improve etch uniformity. The etch step may be carried out at a temperature ranging from ambient to 100° C. or higher.

Optionally, the process chamber may be heated during the etching step to avoid condensation of the gaseous anhydrous HF and water vapor where present. Suitably, the chamber may be heated to a temperature of between about 40° C. and about 45° C. or higher.

It is noted, for the purposes of the instant invention, that the use of anhydrous HF in combination with water vapor is not equivalent to the use of HF vapor. HF vapor is formed from aqueous HF and thus vapor phase HF will be present in its azeotropic composition. By using anhydrous HF in combination with a separate source of water vapor, the ratio of HF to water is not limited to that of the azeotrope. Moreover, it has been found that the combination of anhydrous HF and water is more selective than HF vapor—whereas HF vapor tends to etch TEOS, anhydrous HF can be used to remove residues without attacking the underlying TEOS. The use of anhydrous HF is also believed to provide an etchant whose composition is more stable over time than that which results from the use of HF vapor.

Following etching, the in-process microelectronics device may optionally be rinsed with water and an optional inert gas to remove any by-products which cannot be purged as a gas.

The wafer may then be subjected to any additional processing steps as desired.

The invention is also directed in another embodiment to a method of achieving a uniform etch. The method comprises the steps of providing an in-process microelectronics device, applying liquid, heated water to the surface of the in-process microelectronics device, removing a portion of the liquid water from the surface of the in-process microelectronics device, at least some liquid water remaining on the surface of the in-process microelectronics device and applying anhydrous HF gas and optionally water vapor to the surface of the in-process microelectronics device to etch the in-process microelectronics device. The anhydrous HF may be provided in an inert carrier gas. Desirably no more than about 10 monolayers of water will remain on the surface of the in-process microelectronics device as a result of the removing step.

The invention is also directed in another embodiment to a method of selectively etching an in-process microelectronics device. The method comprises the steps of providing an in-process microelectronics device comprising a first oxide and a second oxide, the in-process microelectronics device in a reaction chamber, applying liquid water at a predetermined temperature to the surface of the in-process microelectronics device while the in-process microelectronics device is in the reaction chamber, removing a portion of the liquid water from the surface of the in-process microelectronics device, at least a portion of the liquid water remaining on the in-process microelectronics device, the in-process microelectronics device in the reaction chamber and selectively etching at least a portion of the surface of the in-process microelectronics device by applying anhydrous HF gas and optionally water vapor to the surface of the in-process microelectronics device, the in-process microelectronics device in the reaction chamber. Desirably, no more than about 10 monolayers of water will remain on the surface of the in-process microelectronics device. The temperature of the liquid water is predetermined to facilitate selectively etching one of the oxides relative to the other oxide during the selectively etching step.

In another embodiment, the instant invention is further directed to a method for etching a surface of an in-process microelectronics device rotating about an axis. As shown in FIG. 1, at least one in-process microelectronics device 32 is positioned on rotatable support 30. Rotatable support 30 is caused to rotate such that the in-process microelectronics device 30 rotates around an axis 34. In-process microelectronics device 32 exposed to a heated liquid to preheat the in-process microelectronics device as the in-process microelectronics device rotates about the axis. A gaseous etchant is then caused to etch the in-process microelectronics device as the in-process microelectronics device rotates about the axis. Desirably, the heated liquid will be water and the etchant will be anhydrous HF.

The rate of rotation of the wafer and duration of rotation may be adjusted as is necessary to remove a desired amount of water from the in-process microelectronics device. Where it is desirable to remove more water from the device, the rate of rotation and/or the duration of rotation may be increased. To remove less water from the device, the rate of rotation and/or the duration of rotation may be decreased.

The invention is also directed in another embodiment to a method of treating a in-process microelectronics device comprising the steps of providing an in-process microelectronics device, applying a liquid cleaning fluid to the surface of the in-process microelectronics device wherein the liquid cleaning fluid is at a temperature above ambient, removing at least a portion of the cleaning fluid from the surface of the in-process microelectronics device, at least some of the cleaning fluid remaining on the in-process microelectronics device and etching the in-process microelectronics device by applying anhydrous HF gas and optionally water or other solvent vapor to the surface of the in-process microelectronics device. Desirably, following the removing step, no more than about 10 monolayers of water will remain on the surface of the in-process microelectronics device. Suitably, a cleaning fluid such as water will be used.

EXAMPLES 1–10

Etch Selectivity Enhancements

In the examples below, BPSG wafers averaging 4,000 Å to 10,000 Å of film and thermal oxide wafers with approximately 3,500 Å of film were loaded into the reaction chamber of an EXCALIBUR® ISR. Atmospheric gases were purged from the reaction chamber and the chamber pressure set at 25 inches IWC (inches water column). Distilled, deionized water heated to a predetermined temperature was dispensed for 7 seconds on to the wafers. The wafers were then subjected to a ten second spin dry in the presence of nitrogen flowing at a rate of 30 standard liters per minute (SLPM) to remove most of the water from the wafer. Following spin drying, the wafers were subjected to an etch-rinse (ER) sequence in which the wafers were treated with water vapor and nitrogen gas, etched using anhydrous HF and optionally water vapor and then treated again with water vapor and nitrogen gas. In the etch step, 200 sccm (standard cubic centimeters) to 250 sccm of anhydrous HF was dispensed for 5 to 40 seconds in the presence of nitrogen flowing at a rate of 16 SLPM and 0 to 10 SLPM of water vapor at 25 IWC chamber pressure. The chemical dispense step was then followed by an additional purge and final rinse and dry sequence.

EXAMPLES 1a–g

Liquid water was deposited on a wafer having thermal oxide thereon. The wafer was spun as described above and then subjected to an ER sequence. During the etch step, anhydrous HF was provided at a temperature of 24° C. and at a flow rate of 200 cubic centimeters (cc) per minute. Water vapor was provided at a temperature of 24° C. and at a flow rate of 10 liters/minute. The chamber heater was set to 30° and the chamber maintained at a temperature of approximately 25° C. The HF and water were provided for 5 seconds. Water was provided at temperatures of approximately 18° C., 19.5° C., 20.5° C., 23° C., 24.5° C., 28° C. and 29° C. Etch depth ranged from 187 Å (at 18° C.) to 156 Å (at 29° C.). The uniformity of the etch ranged from 1.8% (at 18° C.) to 3.2% (at 29° C.).

Figure 2:
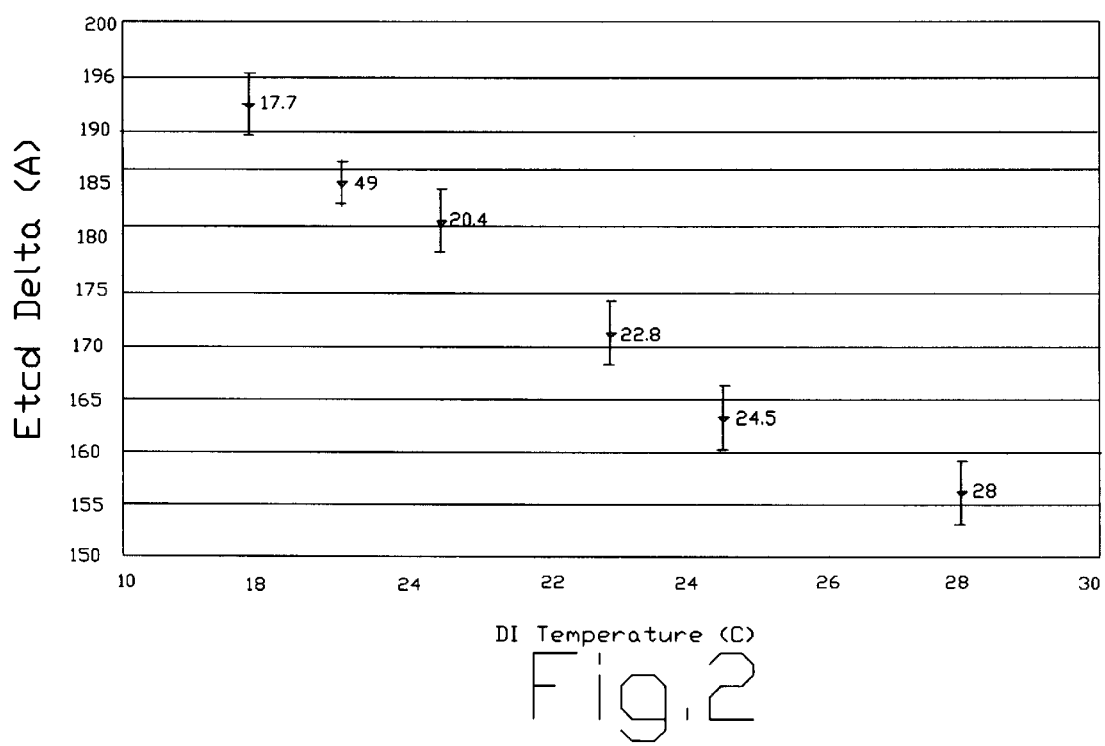
FIG. 2 shows etch delta as a function of the temperature of liquid water applied to an in-process microelectronics device in accordance with an embodiment of the invention.

Examples 1a–g demonstrate that with increasing temperature of the liquid water provided to the in-process microelectronics device, thermal oxide etching decreases and etch uniformity increases. FIG. 2 shows etch delta plotted as a function of the temperature of the liquid water applied to the in-process microelectronics device.

EXAMPLE 2a

A thermal oxide wafer was treated as described above in Example 1a, with the liquid water provided at a temperature of 63° and water vapor provided at room temperature. Additionally, the reaction chamber heater was set to 45° to prevent the formation of condensation in the chamber. Nitrogen was provided at a flow rate of 16 slpm. The average thermal oxide etch depth was 1.6 Å. The etch uniformity was 9.5%.

EXAMPLE 2b

A BPSG wafer was treated as described above in Example 2a. The average etch depth was approximately 380 Å. The etch uniformity was 5.0%.

EXAMPLES 3a AND 3b

A thermal oxide wafer and a BPSG wafer were treated in accordance with Examples 2a and 2b with an etch time of 5 seconds. The average etch depth of the thermal oxide etch was 1 Å. The average etch depth of the BPSG etch was 360 Å. The uniformity of the BPSG etch was 3%.

EXAMPLES 4a AND 4b

A thermal oxide wafer and a BPSG wafer were treated in accordance with Examples 3a and 3b. Total etch time was 10 seconds. No vapor was provided during the etch step. The average etch depth of the thermal oxide etch was 1 Å. The average etch depth of the BPSG etch was 572 Å. The uniformity of the BPSG etch was 3%.

EXAMPLES 5a AND 5b

A thermal oxide wafer and a BPSG wafer were treated in accordance with Examples 4a and 4b with an etch time of 10 seconds. Anhydrous HF was provided at a flow rate of 250 cc/min. The average etch depth of the thermal oxide etch was 1 Å. The average etch depth of the BPSG etch was 1241 Å. The uniformity of the BPSG etch was 3%.

EXAMPLES 6a AND 6b

A thermal oxide wafer and a BPSG wafer were treated in accordance with Examples 4a and 4b with an etch time of 20 seconds. The average etch depth of the thermal oxide etch was 1 Å. The average etch depth of the BPSG etch was 1127 Å. The uniformity of the BPSG etch was 8%.

EXAMPLES 7a and 7b

A thermal oxide wafer and a BPSG wafer were treated in accordance with Examples 3a and 3b with an etch time of 20 seconds. Vapor was provided during the ER sequence at a flow rate of 2L/min. The average etch depth of the thermal oxide etch was 1 Å. The average etch depth of the BPSG etch was 1680 Å. The uniformity of the BPSG etch was 4%.

EXAMPLES 8a AND 8b

A thermal oxide wafer and a BPSG wafer were treated in accordance with Examples 7a and 7b with an etch time of 20 seconds. Vapor was provided during the ER sequence at a flow rate of 4L/min. The average etch depth of the thermal oxide etch was 1 Å. The average etch depth of the BPSG etch was 1708 Å. The uniformity of the BPSG etch was 2%.

EXAMPLES 9a AND 9b

A thermal oxide wafer and a BPSG wafer were treated in accordance with Examples 4a and 4b with an etch time of 20 seconds. Anhydrous HF was provided at a flow rate of 250 cc/min. The average etch depth of the thermal oxide etch was 1 Å. The average etch depth of the BPSG etch was 2754 Å. The uniformity of the BPSG etch was 3%.

EXAMPLES 10a AND 10b

A thermal oxide wafer and a BPSG wafer were treated in accordance with Examples 4a and 4b with an etch time of 40 seconds. The average etch depth of the thermal oxide etch was 1 Å. The average etch depth of the BPSG etch was 2202 Å. The uniformity of the BPSG etch was 3%.

Examples 3–10 are summarized in the Table below.

| Example | Etch Time(s) | HF (sccm) | Vapor (slpm) | Etch Rate BPSG:Tox | Etch Uniformity % BPSG |
|---|---|---|---|---|---|
| 3a,b | 5 | 145 | 10 | 360:1 | 3 |
| 4a,b | 10 | 145 | 0 | 572:1 | 3 |
| 5a,b | 10 | 250 | 0 | 1241:1 | 3 |
| 6a,b | 20 | 145 | 0 | 1127:1 | 8 |
| 7a,b | 20 | 145 | 2 | 1680:1 | 4 |
| 8a,b | 20 | 145 | 4 | 1708:1 | 2 |
| 9a,b | 20 | 250 | 0 | 2754:1 | 3 |
| 10a,b | 40 | 145 | 0 | 2202:1 | 3 | where Tox denotes thermal oxide.

The above examples illustrate that as the temperature of the liquid water applied to the in-process microelectronics device increases, the resultant etch is more selective. The examples also illustrate that selectivity increases with the etch time which results from the increase in BPSG etch rate without initiating etching of the thermal oxide. Further, the examples illustrate that the etch selectivity increases with increasing concentration of anhydrous HF. This results from the increase in BPSG etch delta without initiating etching of the thermal oxide. Finally, the examples demonstrate that BPSG etch uniformity is improved as the amount of vapor dispensed during the etch increases.

In addition to being directed to the embodiments described above and claimed below, the present invention is further directed to embodiments having different combinations of the dependent features described above and/or claimed below.

The above Examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

What is claimed is:

1. A method of selectively etching an in-process microelectronics device comprising the steps of:

providing an in-process microelectronics device comprising a first oxide and a second oxide;

applying liquid water at a predetermined temperature to the surface of the in-process microelectronics device;

removing a portion of the liquid water from the surface of the in-process microelectronics device, at least a portion of the liquid water remaining on the in-process microelectronics device; and selectively etching at least a portion of the surface of the in-process microelectronics device by applying anhydrous HF gas and optionally water vapor to the surface of the in-process microelectronics device, wherein the temperature of the liquid water is predetermined to facilitate selectively etching one of the oxides relative to the other oxide during the selectively etching step.

2. The method of claim 1 further comprising the step of rinsing the in-process microelectronics device following application of the anhydrous HF.

3. The method of claim 1 further comprising the step of treating the in-process microelectronics device with water vapor following the removal of a portion of the liquid water from the in-process microelectronics device and prior to selectively etching the in-process microelectronics device.

4. The method of claim 1 wherein the in-process microelectronics device is selectively etched at ambient temperature.

5. The method of claim 1 wherein the anhydrous HF is provided at ambient temperature.

6. The method of claim 1 wherein the anhydrous HF is provided in an inert carrier gas.

7. The method of claim 6 wherein the carrier gas selected from the group consisting of nitrogen, argon, helium, $CO_2$, Xe, Kr, Ne, Rn, clean dry air and combinations thereof.

8. The method of claim 1 wherein the water is distilled and deionized.

9. The method of claim 1 wherein the liquid water is provided at a temperature above ambient and less than or equal to 100° C.

10. The method of claim 9 wherein the liquid water is provided at a temperature of at least 40° C.

11. The method of claim 9 wherein the water is provided at a temperature of between 60° C. and 90° C.

12. The method of claim 1 wherein the in-process microelectronics device comprises silicon and/or gallium arsenide.

13. The method of claim 1 wherein the in-process microelectronics device includes circuitry or micromachinery thereon.

14. The method of claim 1 wherein a portion of the water is removed from the surface of the in-process microelectronics device by spinning the in-process microelectronics device at a predetermined rate for a predetermined period of time.

15. The method of claim 1 wherein the liquid water remains on the in-process microelectronics device for at least 5 seconds and for no more than 10 seconds prior to removing at least a portion of the liquid water.

16. The method of claim 1 wherein the first oxide is a thermal oxide and the second oxide is a BPSG.

17. The method of claim 1 wherein the in-process microelectronics device includes doped and undoped silicon oxide films.

18. The method of claim 1 wherein the liquid water is removed from the in-process microelectronics device by spinning the in-process microelectronics device.

19. The method of claim 1 wherein:

the temperature of the water is above ambient; and a portion of the liquid water is removed from the surface of the in-process microelectronics device by spinning the in-process microelectronics device.

20. A method of treating an in-process microelectronics device having at least one oxide thereon comprising the steps of:

providing an in-process microelectronics device having at least one oxide thereon;

applying a liquid cleaning fluid to the surface of the in-process microelectronics device wherein the liquid cleaning fluid is at a temperature above ambient;

removing a portion of the liquid cleaning fluid from the surface of the in-process microelectronics device, at least a portion of the liquid cleaning fluid remaining on the surface of the in-process microelectronics device;

applying anhydrous HF gas and optionally water vapor to the surface of the in-process microelectronics device to etch an oxide on at least a portion of the surface of the in-process microelectronics device.

21. The method of claim 20 wherein the liquid cleaning fluid is water.

22. A method for etching a surface of an in-process microelectronics device comprising the steps of:

positioning at least one in-process microelectronics device on a rotatable support;

causing the rotatable support to rotate such that the in-process microelectronics device rotates around an axis;

causing a heated liquid to contact and preheat the in-process microelectronics device as the in-process microelectronics device rotates about the axis; and causing a gaseous etchant to etchingly contact the in-process microelectronics device as the in-process microelectronics device rotates about the axis.

23. The method of claim 22 wherein the liquid is water.

* * * * *